(12) United States Patent
Delgado et al.

(10) Patent No.: US 11,268,911 B2
(45) Date of Patent: Mar. 8, 2022

(54) BORON-BASED CAPPING LAYERS FOR EUV OPTICS

(71) Applicant: KLA-TENCOR CORPORATION, Milpitas, CA (US)

(72) Inventors: Gildardo R Delgado, Livermore, CA (US); Shannon B Hill, Hayward, CA (US); Zefram Marks, Fremont, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 16/413,740

(22) Filed: May 16, 2019

(65) Prior Publication Data

US 2020/0217804 A1     Jul. 9, 2020

Related U.S. Application Data

(60) Provisional application No. 62/788,330, filed on Jan. 4, 2019.

(51) Int. Cl.
    *H01L 27/146*     (2006.01)
    *G01N 21/95*     (2006.01)
    (Continued)

(52) U.S. Cl.
    CPC .......... *G01N 21/9501* (2013.01); *G03F 7/16* (2013.01); *H01L 27/1462* (2013.01); *H01L 27/14685* (2013.01); *H01L 31/0216* (2013.01)

(58) Field of Classification Search
    None
    See application file for complete search history.

(56) References Cited

U.S. PATENT DOCUMENTS

| 6,396,900 B1 | 5/2002 | Barbee, Jr. et al. |
| 7,300,724 B2 | 11/2007 | Yan |
| (Continued) | | |

FOREIGN PATENT DOCUMENTS

| KR | 20040020959 A | 3/2004 |
| KR | 20070096922 A | 10/2007 |
| WO | 2012136420 A1 | 10/2012 |

OTHER PUBLICATIONS

WIPO, ISR for PCT/US2019/068220, Apr. 29, 2020.
(Continued)

*Primary Examiner* — Jack S Chen
(74) *Attorney, Agent, or Firm* — Hodgson Russ LLP

(57) ABSTRACT

Disclosed herein are optical elements and methods for making the same. Such optical elements may comprise a first layer disposed on a substrate, a second layer disposed on the first layer, a terminal layer disposed on the second layer, and a cap layer disposed on the terminal layer. The cap layer may comprise boron, boron nitride, or boron carbide. Such optical elements may be made using a method comprising depositing a first layer using vapor deposition such that the first layer is disposed on a substrate, depositing a second layer using vapor deposition such that the second layer is disposed on the first layer, depositing a terminal layer using vapor deposition such that the terminal layer is disposed on the second layer, and depositing a cap layer comprising boron, boron nitride, or boron carbide using vapor deposition such that the cap layer is disposed on the terminal layer.

9 Claims, 5 Drawing Sheets

(51) Int. Cl.
*G03F 7/16* (2006.01)
*H01L 31/0216* (2014.01)

(56) References Cited

U.S. PATENT DOCUMENTS 9,496,425 B2 11/2016 Chern et al.
9,739,913 B2 * 8/2017 Beasley ............... G02B 5/0816

OTHER PUBLICATIONS

Fernandez-Perea et al., "Optical constants of electron-beam evaporated boron films in the 6.8-900 eV photon anergy range," Journal of the Optical Society of America, Jan. 2008, 31 pages.
Soufli et al., "Optical constants of magnetron sputtered boron carbide thin films from photoabsorption data in the range 30 to 770 eV," Applied Optics, May 2008, 20 pages.
Windt, "IMD-Software for modeling the optical properties of multilayer films," Computers in Physics, Aug. 1998, vol. 12, No. 4, pp. 360-370.

* cited by examiner

BORON-BASED CAPPING LAYERS FOR EUV OPTICS

CROSS REFERENCE TO RELATED APPLICATIONS

This application claims priority to U.S. Provisional Application No. 62/788,330, filed on Jan. 4, 2019, the entire disclosure of which is hereby incorporated by reference.

FIELD OF THE DISCLOSURE

The disclosure generally relates to semiconductor lithography. More particularly the disclosure generally relates to capping layers for EUV optics.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Extreme ultraviolet lithography (EUV) is an emerging lithography technique in semiconductor manufacturing. EUV systems broadly include a laser plasma light source and reflective optics, which generally comprise molybdenum (Mo) silicon (Si) multilayers (Mo:Si) within a controlled ambient environment.

Optics for EUV radiation generally includes multilayer stacks of molybdenum and silicon that are typically a few nanometers thick. The optic performance is severely degraded by oxidation of the silicon and molybdenum layers during operation and buildup of carbon on the topmost surface. A capping layer is applied (or multiple capping layers) to prevent silicon oxidation and allow cleaning of carbon contamination. Boron is well suited to this purpose because it forms with a stable interface with silicon, resists oxidation, has low EUV absorption, and can be deposited in continuous layers using low-temperature sputtering process or higher-temperature chemical vapor deposition.

Existing ruthenium-based cap layers are not robust to oxidative cleaning methods such as ultraviolet-ozone (UVO) and plasmas. They must be cleaned using atomic hydrogen (H), which requires large flows of hydrogen ($H_2$). This significantly increases the expense, design complexity, and safety risks of the optical system.

Existing metal oxide cap layers, e.g., titanium dioxide ($TiO_2$), zirconium oxide ($ZrO_2$), and niobium pentoxide ($Nb_2O_5$), are robust against oxidative cleaning, but they absorb more EUV light than boron. Because of this, they must be less than approximately 3 nm thick. This does not provide sufficient protection of the underlying silicon from oxidation during EUV exposures.

Therefore, improved cap layers for EUV optics are needed.

SUMMARY OF THE DISCLOSURE

Disclosed herein are boron-based capping layers for EUV optics, and methods of making the same.

In an embodiment, an optical element may comprise a first layer disposed on a substrate, a second layer disposed on the first layer, a terminal layer disposed on the second layer, and a cap layer disposed on the terminal layer. There may be a single first layer and a single second layer, or there may be multiples of the first layer or multiples of the second layer.

In another embodiment, a method of making an optical element is provided. The method may include depositing a first layer, depositing a second layer, depositing a terminal layer, and depositing a cap layer. The first layer may be deposited using vapor deposition and may be deposited such that it is disposed on a substrate. The second layer may be deposited using vapor deposition and may be deposited such that it is disposed on the first layer. The terminal layer may be deposited using vapor deposition and may be deposited such that it is disposed on the second layer. There may be a single first layer and a single second layer, or there may be multiples of the first layer or multiples of the second layer. The cap layer may be deposited using vapor deposition and may be deposited such that it is disposed on the terminal layer.

The method may further comprise depositing a diffusion barrier. The diffusion barrier may be deposited using vapor deposition, and may be deposited such that the diffusion barrier is disposed on the terminal layer and the cap layer is disposed on the diffusion barrier.

The method may further comprise depositing a terminal cap layer using vapor deposition. The terminal cap layer may be deposited such that the terminal cap layer is disposed on the cap layer.

The cap layer may comprise boron, boron nitride, or boron carbide, or any combination thereof.

The cap layer may be deposited using magnetron sputtering.

The optical element may comprise an extreme ultraviolet lithosystem that includes the optical element. Alternatively, the optical element may comprise an inspection system that includes the optical element.

The cap layer may comprise boron. The cap layer may have, or may be deposited to, a thickness ranging from 5 nm to 30 nm inclusive.

The cap layer may comprise boron nitride. The cap layer may have, or may be deposited to, a thickness from 2 nm to 10 nm inclusive.

The cap layer may comprise boron carbide. The cap layer may have, or may be deposited to, a thickness from 2 nm to 25 nm inclusive.

The optical element may further comprise a diffusion barrier. The diffusion barrier may be disposed on the terminal layer, and may be such that the cap layer is disposed on the diffusion barrier.

The diffusion barrier may comprise carbon.

The optical element may comprise a terminal cap layer. The terminal cap layer may be disposed on the cap layer.

The terminal cap layer may comprise ruthenium, titanium dioxide, zirconium dioxide, or niobium oxide, or any combination thereof.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Figure 1A:
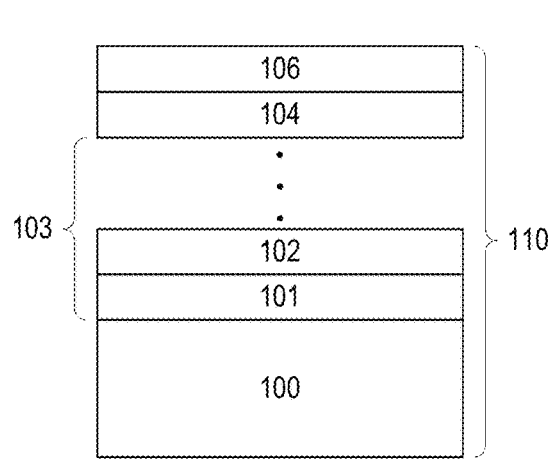
FIG. 1A illustrates an optical element having a protective cap layer.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Ranges of values are disclosed herein. The ranges set out a lower limit value and an upper limit value. Unless otherwise stated, the ranges include all values to the magnitude of the smallest value (either lower limit value or upper limit value) and ranges between the values of the stated range.

All ranges provided herein include all values that fall within the ranges to the tenth decimal place, unless indicated otherwise.

EUV optics can be degraded severely by oxidation of constituent silicon and molybdenum layers, as well as by the build-up of carbon (C). Boron (B)-based materials, like pure boron (B), boron nitride (BN), and boron carbide ($B_4C$) can be deposited in dense, thick layers that form strong bonds with silicon to resist oxidation during EUV exposure and enable cleaning of carbon contamination. Boron carbide has long been used as a thin (<2 nm) buffer layer between other materials to prevent diffusion. Thus, protection layers, or capping layers, containing boron for EUV optics, which may be greater than approximately 2-4 nm in thickness, are disclosed herein.

Boron-based protection layers are highly resistant to oxidation, can be used as a cap or buffer layer to prevent oxidation of silicon, and may form a passivation layer of boron carbide on a surface, reducing further carbon contamination. They can be cleaned to atomic levels by molecular hydrogen, hydrogen plasmas, UVO, or other ultraviolet (UV)-activated oxidative cleaning, vacuum ultraviolet (VUV)-activated oxidative cleaning, or EUV-activated oxidative cleaning, oxygen plasmas, or other plasmas. They have a lower EUV absorption than most other capping materials. This allows for a thicker protection layer. The unique optical properties of boron interact with constructive interference of EUV optics to produce enhanced reflectivity for boron layer thicknesses between 8 and 12 nm. Boron-based protection layers may be used as a distributed spectral purity filter to suppress the out-of-band reflectivity in the range of approximately 130 to 430 nm, which is comparable to the 13.5 nm reflectivity for ruthenium (Ru)-capped optics.

The unique optical properties of boron interact with constructive interference of EUV optics, causing reflectivity to increase with increasing boron thickness between approximately 7 and 10 nm. The resulting local reflectivity maximum between approximately 9 and 10 nm is only 3.5% lower than the absolute maximum. Similar resonant effects do not occur or result in much lower local-max reflectivity for metal-oxide or ruthenium cap materials.

The out-of-band reflectivity of typical ruthenium-capped molybdenum silicon multilayer in the range of approximately 200-400 nm is comparable to the in-band reflectivity at 13.5 nm. Capping with greater than 5 nm of boron reduces this ration of out-of-band to in-band reflectivity by greater than ten times, reducing unwanted light from reaching the detector.

Embodiments disclosed herein include boron-based protective cap layers for EUV optics and methods of making the same. The boron-based protective cap layers may be a component of an EUV lithosystem, which includes the optical element.

As illustrated in FIG. 1A, an embodiment of the present disclosure may be an optical element 110 for use in EUV lithography. Optical element 110 may comprise a sequence 103, disposed on a substrate 100, of a first layer 101 and a second layer 102 disposed on the first layer 101. There may be only one of each of the first layer 101 and second layer 102 in sequence 103, or there may be n first layers 101 and n second layers 102 in sequence 103. Disposed on sequence 103—on the second layer 102, if there is only a single second layer 102, or on the nth second layer 102, if there are n second layers 102—may be a terminal layer 104. A cap layer 106 may be disposed on terminal layer 104. In this instance, the sequence of layers on the substrate of optical element 110 may be: (i) one or more first layer(s) 101 and second layer(s) 102, (ii) terminal layer 104, and (iii) cap layer 106.

Figure 1B:
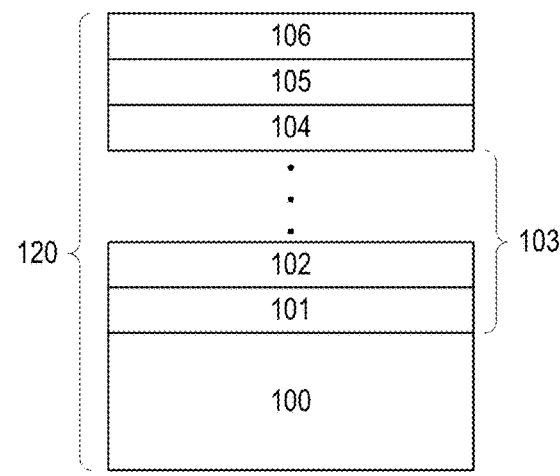
FIG. 1B illustrates an optical element having a protective cap layer.

As illustrated in FIG. 1B, an embodiment of the present disclosure may be an optical element 120 for use in EUV lithography. Optical element 120 may be similar to optical element 110, but it may additionally include a diffusion barrier 105. In this way, optical element 120 may comprise a sequence 103, disposed on a substrate 100, of a first layer 101 and a second layer 102 disposed on the first layer 101. There may be only one of each of the first layer 101 and second layer 102 in sequence 103, or there may be n first layers 101 and n second layers 102 in sequence 103. Disposed on sequence 103—on the second layer 102, if there is only a single second layer 102, or on the nth second layer 102, if there are n second layers 102—may be a terminal layer 104. A cap layer 106 may disposed on terminal layer 104, but between terminal layer 104 and cap layer 106 is diffusion barrier 105, such that diffusion barrier 105 is disposed on terminal layer 104 and cap layer 106 is disposed on diffusion barrier 105. In other words, optical element 120 may include diffusion barrier 105 disposed on terminal layer 104 such that cap layer 106 is disposed on diffusion barrier 105. In this instance, the sequence of layers on the substrate of optical element 120 may be: (i) one or more first layer(s) 101 and second layer(s) 102, (ii) terminal layer 104, (iii) diffusion barrier 105, and (iv) cap layer 106.

Figure 1C:
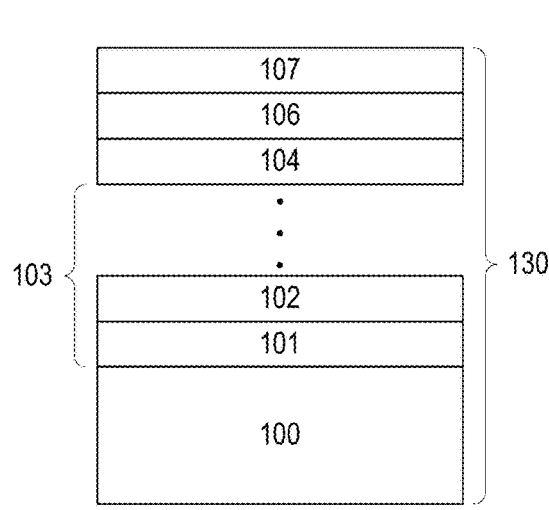
FIG. 1C illustrates an optical element having a protective cap layer.

As illustrated in FIG. 1C, an embodiment of the present disclosure may be an optical element 130 for use in EUV lithography. Optical element 130 may be similar to optical element 110, but it may additionally include a terminal cap layer 107. In this way, optical element 130 may comprise a sequence 103, disposed on a substrate 100, of a first layer 101 and a second layer 102 disposed on the first layer 101. There may be only one of each of the first layer 101 and second layer 102 in sequence 103, or there may be n first layers 101 and n second layers 102 in sequence 103. Disposed on sequence 103—on the second layer 102, if there is only a single second layer 102, or on the nth second layer 102, if there are n second layers 102—may be a terminal layer 104. A cap layer 106 may disposed on terminal layer 104. A terminal cap layer 107 may be disposed on cap layer 106. In this instance, the sequence of layers on the substrate of optical element 130 may be: (i) one or more first layer(s) 101 and second layer(s) 102, (ii) terminal layer 104, (iii) cap layer 106, and (iv) terminal cap layer 107.

Figure 1D:
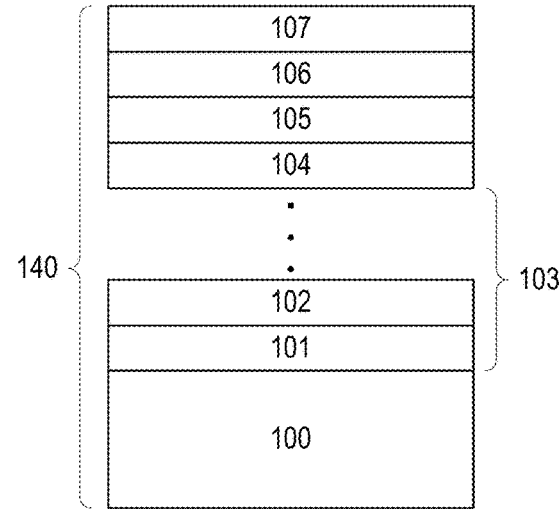
FIG. 1D illustrates an optical element having a protective cap layer.

As illustrated in FIG. 1D, an embodiment of the present disclosure may be an optical element 140 for use in EUV lithography. Optical element 140 may be similar to optical element 110, but it may additionally include a diffusion barrier 105 and a terminal cap layer 107. In this way, optical element 140 may comprise a sequence 103, disposed on a substrate 100, of a first layer 101 and a second layer 102 disposed on the first layer 101. There may be only one of each of the first layer 101 and second layer 102 in sequence 103, or there may be n first layers 101 and n second layers 102 in sequence 103. Disposed on sequence 103—on the second layer 102, if there is only a single second layer 102, or on the nth second layer 102, if there are n second layers 102—may be a terminal layer 104. A cap layer 106 may disposed on terminal layer 104, but between terminal layer 104 and cap layer 106 is diffusion barrier 105, such that diffusion barrier 105 is disposed on terminal layer 104 and cap layer 106 is disposed on diffusion barrier 105. In other words, optical element 120 may include diffusion barrier 105 disposed on terminal layer 104 such that cap layer 106 is disposed on diffusion barrier 105. A terminal cap layer 107 may be disposed on cap layer 106. In this instance, the sequence of layers on the substrate of optical element 140 may be: (i) one or more first layer(s) 101 and second layer(s) 102, (ii) terminal layer 104, (iii) diffusion barrier 105, (iv) cap layer 106, and (v) terminal cap layer 107.

Other embodiments of the present disclosure are methods for making an optical element for use in EUV lithography.

Figure 2A:
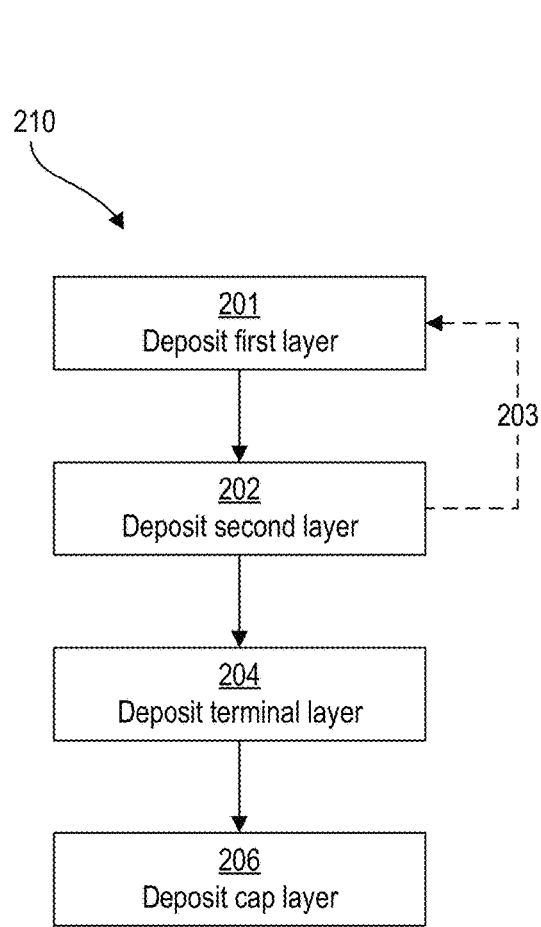
FIG. 2A illustrates a method of forming an optical element having a protective cap layer.

As illustrated in FIG. 2A, an embodiment of the present disclosure may be a method 210 for making an optical element for use in EUV lithography. Method 210 may be used, for example, to make optical element 110. Method 210 may comprise deposition step 201 of depositing a first layer such that the first layer may be disposed on a substrate, which may be accomplished using, for example vapor deposition. Next may be deposition step 202 of depositing a second layer such that the second layer may be disposed on the first layer, which may be accomplished using, for example, vapor deposition. There may optionally be additional first layers and second layers deposited, up to and including n first layers and n second layers. Thus, for n desired first layers and n desired second layers, there may be m repetitions 203 of depositing the first layer and the second layer, where m=n−1. In this way, each additional m first layer, after the initial first layer, may be disposed on the previous m−1 second layer, up to n first layers and n second layers. Next may be deposition step 204 of depositing a terminal layer such that the terminal layer may be disposed on the second layer. It should be noted that where there may be only one second layer, the terminal layer may be deposited such that it may be disposed on the second layer, and where there are n second layers, the terminal layer may be deposited such that it may be disposed on the nth second layer. Next may be deposition step 206 of depositing a cap layer such that the cap layer may be disposed on the terminal layer. In this instance, when completed, the sequence of layers on the substrate produced according to method 210 may be: (i) one or more first layer(s) and second layer(s), (ii) a terminal layer, and (iii) a cap layer.

Figure 2B:
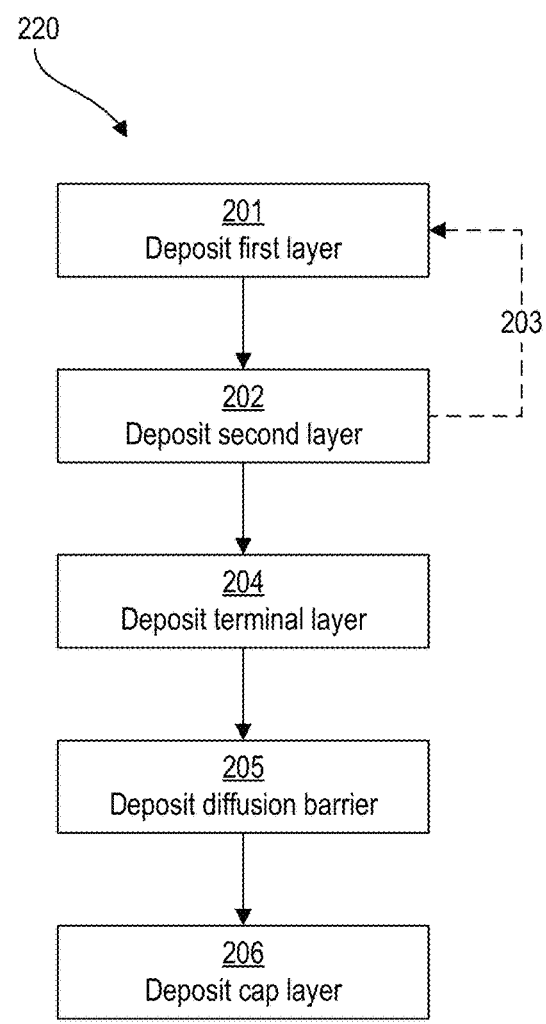
FIG. 2B illustrates a method of forming an optical element having a protective cap layer.

As illustrated in FIG. 2B, an embodiment of the present disclosure may be a method 220 for making an optical element for use in EUV lithography. Method 220 may be similar to method 210, but it may additionally include a deposition step 205 for depositing a diffusion barrier. Method 220 may be used, for example, to make optical element 120. Method 220 may comprise deposition step 201 of depositing a first layer such that the first layer may be disposed on a substrate, which may be accomplished using, for example vapor deposition. Next may be deposition step 202 of depositing a second layer such that the second layer may be disposed on the first layer, which may be accomplished using, for example, vapor deposition. There may optionally be additional first layers and second layers deposited, up to and including n first layers and n second layers. Thus, for n desired first layers and n desired second layers, there may be m repetitions 203 of depositing the first layer and the second layer, where m=n−1. In this way, each additional m first layer, after the initial first layer, may be disposed on the previous m−1 second layer, up to n first layers and n second layers. Next may be deposition step 204 of depositing a terminal layer such that the terminal layer may be disposed on the second layer. It should be noted that where there may be only one second layer, the terminal layer may be deposited such that it may be disposed on the second layer, and where there are n second layers, the terminal layer may be deposited such that it may be disposed on the nth second layer. Next may be deposition step 206 of depositing a cap layer such that the cap layer may be disposed on the terminal layer, but prior to deposition step 206, deposition step 205 may be performed. Deposition step 205 may include depositing a diffusion barrier such that the diffusion barrier may be disposed on the terminal layer and, after deposition step 206, the cap layer may be disposed on the diffusion barrier. In this instance, when completed, the sequence of layers on the substrate produced according to method 210 may be: (i) one or more first layer(s) and second layer(s), (ii) a terminal layer, (iii) a diffusion barrier, and (iv) a cap layer.

Figures 2C, 2D:
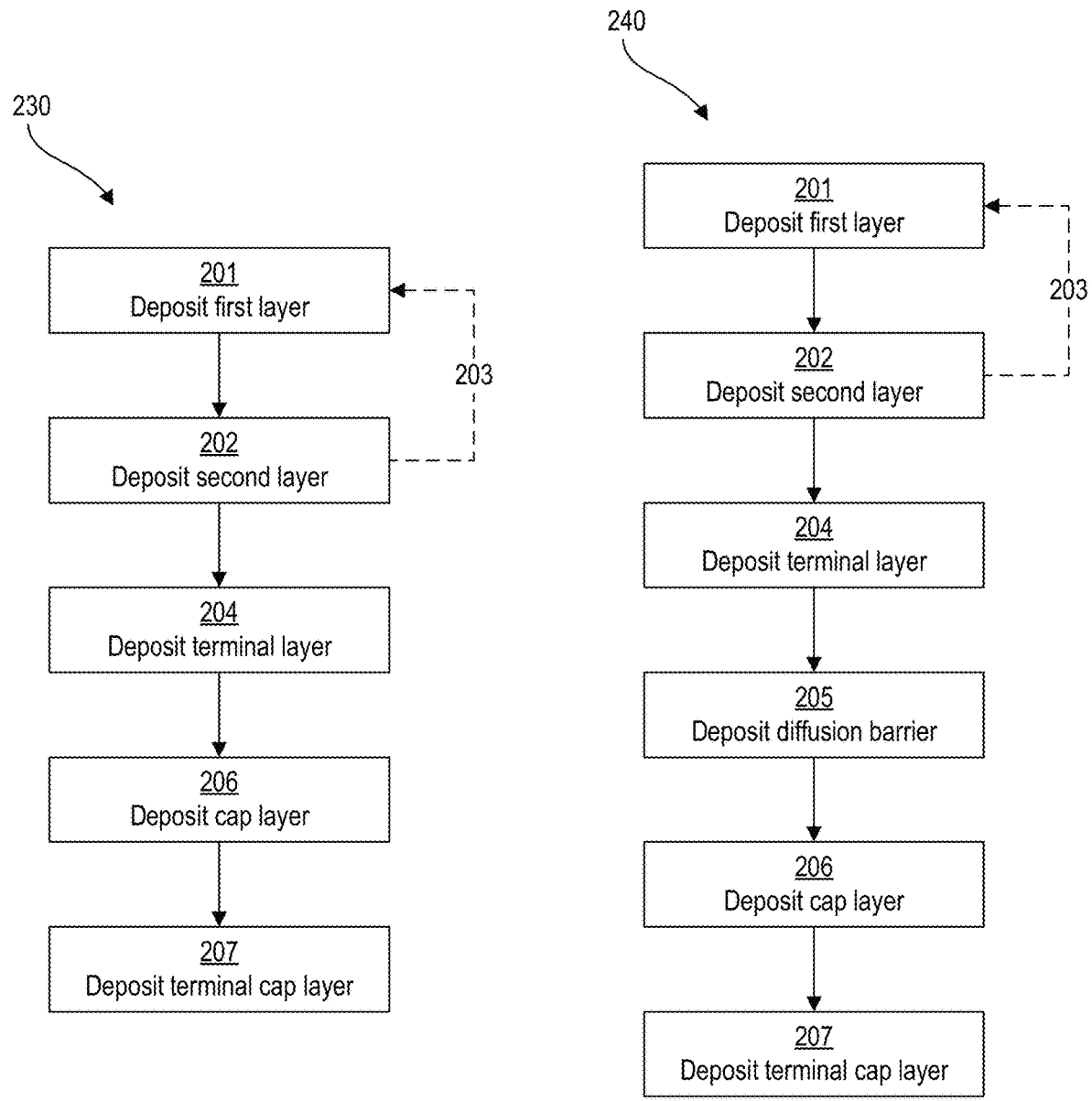
FIG. 2C illustrates a method of forming an optical element having a protective cap layer.
FIG. 2D illustrates a method of forming an optical element having a protective cap layer.

As illustrated in FIG. 2C, an embodiment of the present disclosure may be a method 230 for making an optical element for use in EUV lithography. Method 230 may be similar to method 210, but it may additionally include a deposition step 207 for depositing a terminal cap layer. Method 230 may be used, for example, to make optical element 130. Method 230 may comprise deposition step 201 of depositing a first layer such that the first layer may be disposed on a substrate, which may be accomplished using, for example vapor deposition. Next may be deposition step 202 of depositing a second layer such that the second layer may be disposed on the first layer, which may be accomplished using, for example, vapor deposition. There may optionally be additional first layers and second layers deposited, up to and including n first layers and n second layers. Thus, for n desired first layers and n desired second layers, there may be m repetitions 203 of depositing the first layer and the second layer, where m=n−1. In this way, each additional m first layer, after the initial first layer, may be disposed on the previous m−1 second layer, up to n first layers and n second layers. Next may be deposition step 204 of depositing a terminal layer such that the terminal layer may be disposed on the second layer. It should be noted that where there may be only one second layer, the terminal layer may be deposited such that it may be disposed on the second layer, and where there are n second layers, the terminal layer may be deposited such that it may be disposed on the nth second layer. Next may be deposition step 206 of depositing a cap layer such that the cap layer may be disposed on the terminal layer. Next may be deposition step 207 of depositing a terminal cap layer such that the terminal cap layer may be disposed on the cap layer. In this instance, when completed, the sequence of layers on the substrate produced according to method 210 may be: (i) one or more first layer(s) and second layer(s), (ii) a terminal layer, (iii) a cap layer, and (iv) a terminal cap layer.

As illustrated in FIG. 2D, an embodiment of the present disclosure may be a method 240 for making an optical element for use in EUV lithography. Method 240 may be similar to method 210, but it may additionally include a deposition step 205 for depositing a diffusion barrier and deposition step 207 for depositing a terminal cap layer. Method 240 may be used, for example, to make optical element 140. Method 240 may comprise deposition step 201 of depositing a first layer such that the first layer may be disposed on a substrate, which may be accomplished using, for example vapor deposition. Next may be deposition step 202 of depositing a second layer such that the second layer may be disposed on the first layer, which may be accomplished using, for example, vapor deposition. There may optionally be additional first layers and second layers deposited, up to and including n first layers and n second layers. Thus, for n desired first layers and n desired second layers, there may be m repetitions 203 of depositing the first layer and the second layer, where m=n−1. In this way, each additional m first layer, after the initial first layer, may be disposed on the previous m−1 second layer, up to n first layers and n second layers. Next may be deposition step 204 of depositing a terminal layer such that the terminal layer may be disposed on the second layer. It should be noted that where there may be only one second layer, the terminal layer may be deposited such that it may be disposed on the second layer, and where there are n second layers, the terminal layer may be deposited such that it may be disposed on the nth second layer. Next may be deposition step 206 of depositing a cap layer such that the cap layer may be disposed on the terminal layer, but prior to deposition step 206, deposition step 205 may be performed. Deposition step 205 may include depositing a diffusion barrier such that the diffusion barrier may be disposed on the terminal layer and, after deposition step 206, the cap layer may be disposed on the diffusion barrier. Next may be deposition step 207 of depositing a terminal cap layer such that the terminal cap layer may be disposed on the cap layer. In this instance, when completed, the sequence of layers on the substrate produced according to method 210 may be: (i) one or more first layer(s) and second layer(s), (ii) a terminal layer, (iii) a diffusion barrier, (iv) a cap layer, and (v) a terminal cap layer.

Deposition step 201 may, for example, be a deposition of a first layer 101 illustrated in FIGS. 1A-1D. Deposition step 202 may, for example, be a deposition of a second layer 102 illustrated in FIGS. 1A-1D. Repetition 203 may, for example, be forming a sequence 103 illustrated in FIGS. 1A-1D. Deposition step 204 may, for example, be deposition of a terminal layer 104 illustrated in FIGS. 1A-1D. Deposition step 205 may, for example, be a deposition of a diffusion barrier 105 illustrated in FIGS. 1B and 1D. Deposition step 206 may, for example, be a deposition of a cap layer 106 illustrated in FIGS. 1A-1D. Deposition step 207 may, for example, be a deposition of a terminal cap layer 107 illustrated in FIGS. 1C and 1D.

Deposition according to any of the methods described herein may be, inter alia, vapor deposition, physical vapor deposition, chemical vapor deposition, sputtering, or magnetron sputtering.

First layer(s) 101, which may also refer to one or more first layers deposited using deposition step 201, may comprise, for example, silicon (Si).

Second layer(s) 102, which may also refer to one or more first layers deposited using deposition step 202, may comprise, for example, molybdenum (Mo).

Terminal layer(s) 104, which may also refer to a terminal layers deposited using deposition step 204, may comprise, for example, silicon (Si).

Diffusion barrier 105, which may also refer to a diffusion barrier deposited using deposition step 205, may comprise, for example, carbon, or another suitable material or combination of materials.

Cap layer 106, which may also refer to a cap layer deposited using deposition step 206, may comprise boron, boron nitride (BN), or boron carbide ($B_4C$). Where cap layer 106 comprises boron, it may have a thickness ranging from 5 nm to 30 nm inclusive. Where cap layer 106 comprises boron nitride, it may have a thickness ranging from 2 nm to 10 nm inclusive. Alternatively, where cap layer 106 comprises boron nitride, it may have a thickness ranging from 4 nm to 10 nm inclusive. Where cap layer 106 comprises boron carbide, it may have a thickness ranging from 2 nm to 25 nm inclusive. Alternatively, where cap layer 106 comprises boron carbide, it may have a thickness ranging from 4 nm to 25 nm inclusive. These thickness ranges may refer to the final deposited thickness over the entire cap layer 106, or may refer to target thicknesses or thickness tolerances for cap layer 106. In an embodiment, when referring to target thicknesses, there may be a finished target thickness of cap layer 106 having varying actual thickness, but the average, or target thickness of the material falls within the range herein for the composition material of cap layer 106. In this way, the actual thickness at any given point on cap layer 106 may be higher or lower than the average, or target thickness. In another embodiment, when referring to thickness tolerance, there may be a finished thickness of cap layer 106 having varying thickness, but bounded by the ranges given herein as tolerance levels, or minimum and maximum thicknesses of cap layer 106. In this way, the actual thickness at any given point on cap layer 106 may fall within the given range of thicknesses. Further embodiments may require a target thickness of cap layer 106 to fall within the range specified for the composition material and be bounded by the minima and maxima described.

Cap layer 106 may alternatively comprise any combination of boron, boron carbide, and boron nitride. In one instance, the cap layer may comprise a boron carbide cap layer, a boron cap layer, and a boron nitride cap layer.

Terminal cap layer 107, which may also refer to a terminal cap layer deposited using deposition step 207, may comprise, for example, ruthenium (Ru), titanium dioxide ($TiO_2$), zirconium dioxide ($ZrO_2$), or niobium oxide. Niobium oxide may refer to the varying oxidation states of niobium, including, inter alia, niobium monoxide (NbO), niobium dioxide ($NbO_2$), or niobium pentoxide ($Nb_2O_5$).

First layer 101, second layer 102, terminal layer 104, diffusion barrier 105, cap layer 106, and terminal cap layer 107 may comprise materials having varying physical properties, depending on the application. For instance, the materials may vary in porosity, density, and uniformity depending on the application and the deposition process used. In some embodiments, the porosity, density, and uniformity are optimized and others may favor one or more of porosity, density, or uniformity to be optimized. There may also be a tolerance of impurity specified based on the application and inspection needs. Such an impurity tolerance may be determined based on, inter alia, the material or set by the manufacturer.

Figure 3:
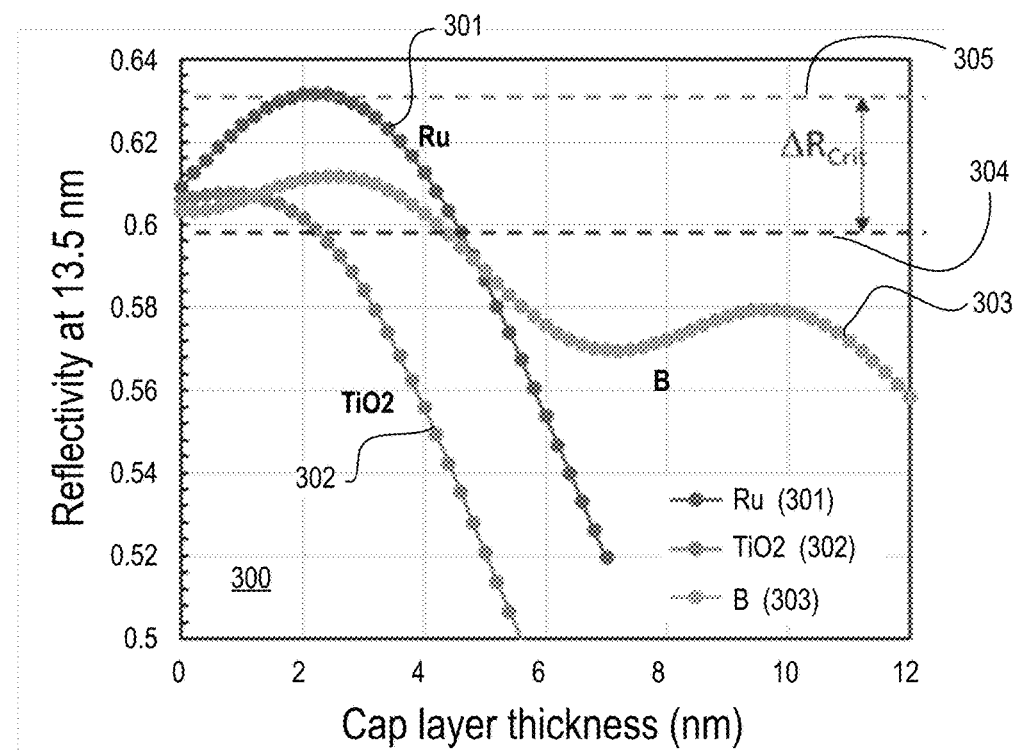
FIG. 3 illustrates a plot of reflectivity of a typical optical element as a function of cap layer thickness.

To demonstrate the potential of boron as a capping layer, simulations of were performed using IMD software and the optical constants at 13.5 nm that have been measured for boron, silicon, molybdenum, and boron carbide, and calculated for titanium dioxide, ruthenium, and boron nitride. FIG. 3 depicts a plot 300 showing the reflectivity R of a typical Mo:Si multilayer optic as a function of cap-layer thickness for different capping materials, i.e., ruthenium (curve 301), titanium dioxide (curve 302), and boron (curve 303). The non-monotonic dependence of R on cap thickness is due to constructive interference inherent to multilayer optics.

An alternative cap layer should not decrease the reflectivity of the standard 2.2 nm ruthenium-capped multilayer mirror by more than some critical amount, $\Delta R_{Crit}$. For the simulations shown in FIG. 3, $\Delta R_{Crit}$=3.5% (between lower $R_{Crit}$ (304) and upper $R_{Crit}$ (305)) is used, which is typical for acceptable losses. This limits the thickness of ruthenium and titanium dioxide caps to 4.5 nm and 2.2 nm, respectively. This thickness of titanium dioxide can be insufficient to protect against oxidation of the underlying silicon during years of EUV exposure.

A critical thickness of 4.2 nm for boron should provide sufficient protection against oxidation based on the performance of existing 5 nm coatings on Si-based detectors. If a larger reflectivity loss of 5% is an acceptable tradeoff to more than double the cap layer thickness, a 9.8 nm boron layer could be used, taking advantage of the local maximum in the curve for boron 303 shown in FIG. 3.

Similar calculations show that 4-5 nm layers of pure boron nitride and boron carbide also have acceptable reflectivity losses. Since boron carbide is known as an effective diffusion barrier, and boron nitride is known to be highly resistant to oxidation and oxygen diffusion, it is possible that the best balance of stability over time, oxidation resistance and reflectivity may be obtained with a structure (from bottom to top): silicon/boron carbide/boron/boron nitride.

Figure 4:
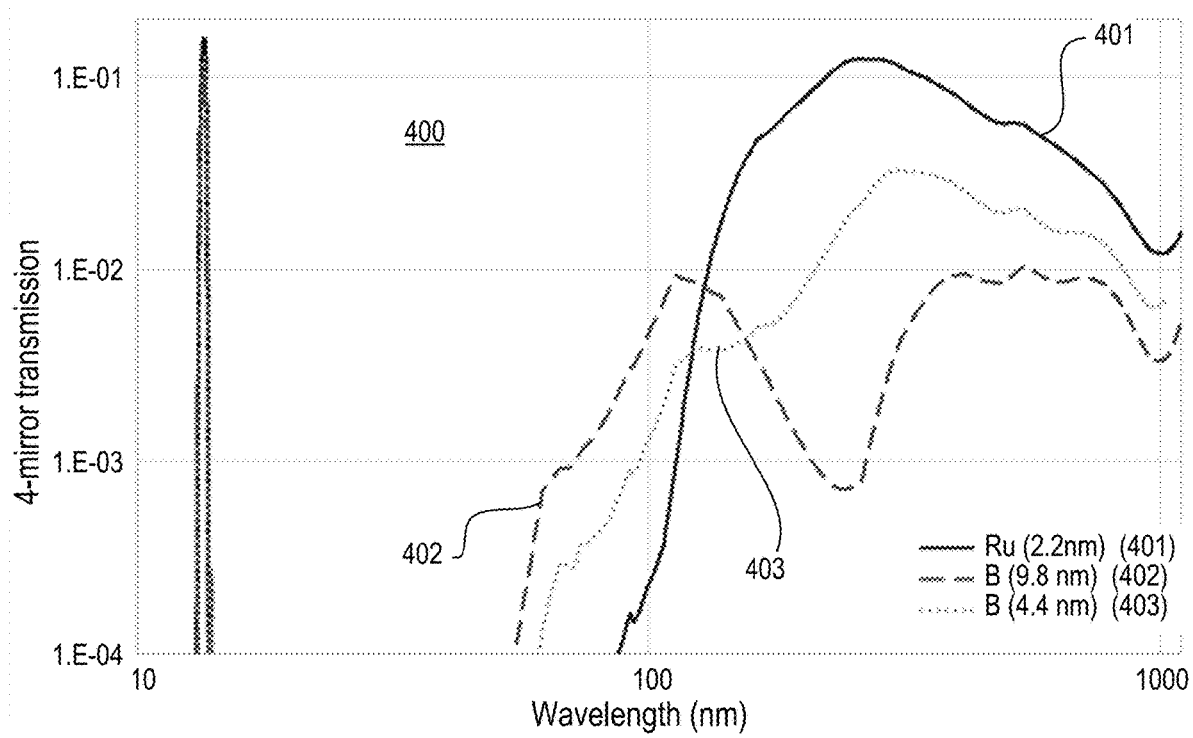
FIG. 4 illustrates calculated transmission of an illustrative optical system.

To show the effectiveness of boron capping layers as a distributed spectral purity filter, FIG. 4 depicts a plot 400 of the calculated transmission of an illustrative 4-mirror system with boron and ruthenium coatings, i.e., for 2.2 nm ruthenium (described by plot line 401), 9.8 nm boron (described by plot line 402), and 4.4 nm boron (described by plot line 403). For the typical capping of 2.2 nm of ruthenium, the system transmission in the range 200-400 nm is comparable to the in-band reflectivity at 13.5 nm. The transmission over the range 130 to 430 nm is reduced 10-100× by using boron capping layers, with thicker boron resulting in greater suppression. This trend with thickness is reversed in the 50-130 nm range; therefore, a tradeoff must be made between the suppression of these two bands.

Figure 5:
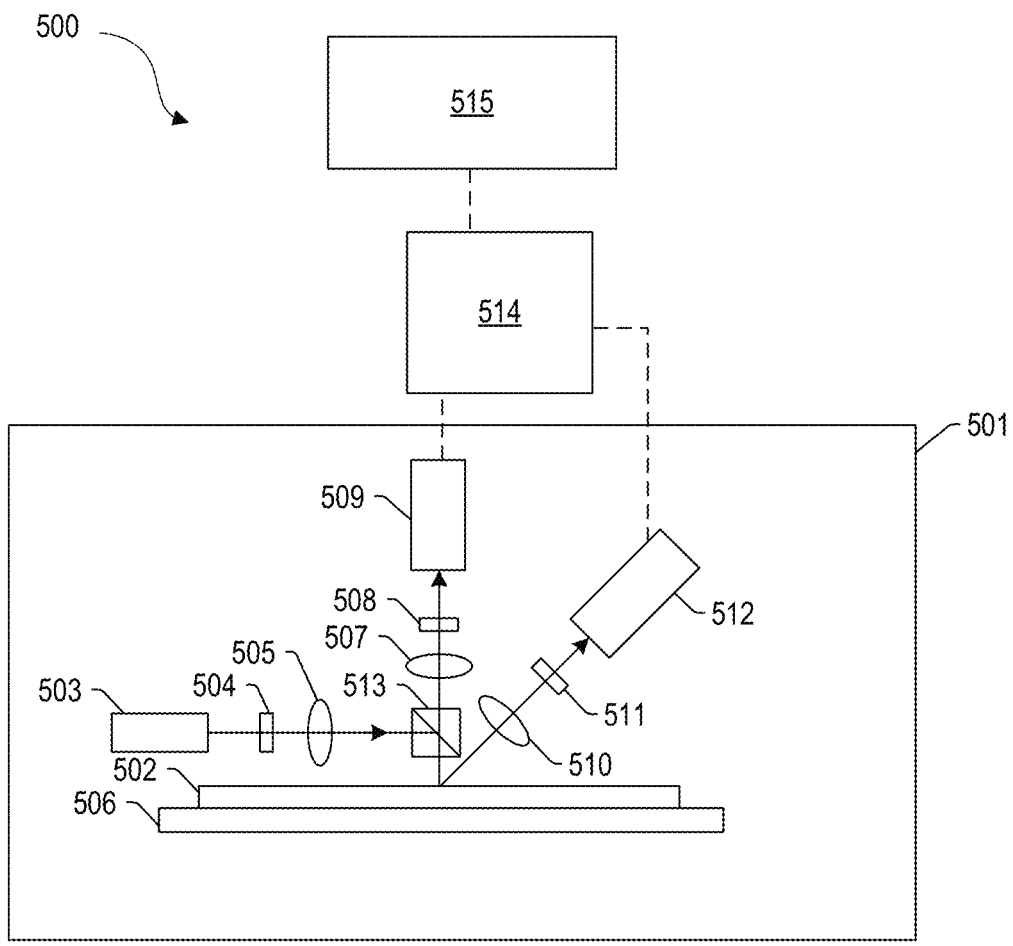
FIG. 5 illustrates an optical system according to embodiments of the present disclosure.

One embodiment of a system 500 is shown in FIG. 5. The system 500 includes optical based subsystem 501. In general, the optical based subsystem 501 is configured for generating optical based output for a specimen 502 by directing light to (or scanning light over) and detecting light from the specimen 502. In one embodiment, the specimen 502 includes a wafer. The wafer may include any wafer known in the art. In another embodiment, the specimen includes a reticle. The reticle may include any reticle known in the art.

In the embodiment of the system 500 shown in FIG. 5, optical based subsystem 501 includes an illumination subsystem configured to direct light to specimen 502. The illumination subsystem includes at least one light source. For example, as shown in FIG. 5, the illumination subsystem includes light source 503. In one embodiment, the illumination subsystem is configured to direct the light to the specimen 502 at one or more angles of incidence, which may include one or more oblique angles and/or one or more normal angles. For example, as shown in FIG. 5, light from light source 503 is directed through optical element 504 and then lens 505 to specimen 502 at an oblique angle of incidence. The oblique angle of incidence may include any suitable oblique angle of incidence, which may vary depending on, for instance, characteristics of the specimen 502.

The optical based subsystem 501 may be configured to direct the light to the specimen 502 at different angles of incidence at different times. For example, the optical based subsystem 501 may be configured to alter one or more characteristics of one or more elements of the illumination subsystem such that the light can be directed to the specimen 502 at an angle of incidence that is different than that shown in FIG. 5. In one such example, the optical based subsystem 501 may be configured to move light source 503, optical element 504, and lens 505 such that the light is directed to the specimen 502 at a different oblique angle of incidence or a normal (or near normal) angle of incidence.

In some instances, the optical based subsystem 501 may be configured to direct light to the specimen 502 at more than one angle of incidence at the same time. For example, the illumination subsystem may include more than one illumination channel, one of the illumination channels may include light source 503, optical element 504, and lens 505 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 502 at different angles of incidence may be different such that light resulting from illumination of the specimen 502 at the different angles of incidence can be discriminated from each other at the detector(s).

In another instance, the illumination subsystem may include only one light source (e.g., light source 503 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen 502. Multiple illumination channels may be configured to direct light to the specimen 502 at the same time or at different times (e.g., when different illumination channels are used to sequentially illuminate the specimen). In another instance, the same illumination channel may be configured to direct light to the specimen 502 with different characteristics at different times. For example, in some instances, optical element 504 may be configured as a spectral filter and the properties of the spectral filter can be changed in a variety of different ways (e.g., by swapping out the spectral filter) such that different wavelengths of light can be directed to the specimen 502 at different times. The illumination subsystem may have any other suitable configuration known in the art for directing the light having different or the same characteristics to the specimen 502 at different or the same angles of incidence sequentially or simultaneously.

In one embodiment, light source 503 may include a broadband plasma (BBP) source or an extreme ultraviolet lithography (EUV) source. In this manner, the light generated by the light source 503 and directed to the specimen 502 may include broadband light or ultraviolet light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 503 may also include a polychromatic light source that generates light at multiple discrete wavelengths or wavebands.

Light from optical element 504 may be focused onto specimen 502 by lens 505. Although lens 505 is shown in FIG. 5 as a single refractive optical element, it is to be understood that, in practice, lens 505 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 513), aperture(s), and the like, which may include any such suitable optical elements known in the art. In addition, the optical based subsystem 501 may be configured to alter one or more of the elements of the illumination subsystem based on the type of illumination to be used for generating the optical based output. Such optical elements may have a first layer, second layer, terminal layer, and cap layer as described herein and depicted, for example, in FIG. 1A. Such optical elements may additionally have a diffusion barrier, a terminal cap layer, or both as described herein and depicted, for example, in FIGS. 1B-1D. The layers and barriers described here may be formed using, for example, one of the methods described herein and depicted in FIGS. 2A-2D as appropriate.

The optical based subsystem 501 may also include a scanning subsystem configured to cause the light to be scanned over the specimen 502. For example, the optical based subsystem 501 may include stage 506 on which specimen 502 is disposed during optical based output generation. The scanning subsystem may include any suitable mechanical and/or robotic assembly (that includes stage 506) that can be configured to move the specimen 502 such that the light can be scanned over the specimen 502. In addition, or alternatively, the optical based subsystem 501 may be configured such that one or more optical elements of the optical based subsystem 501 perform some scanning of the light over the specimen 502. The light may be scanned over the specimen 502 in any suitable fashion such as in a serpentine-like path or in a spiral path.

The optical based subsystem 501 further includes one or more detection channels. At least one of the one or more detection channels includes a detector configured to detect light from the specimen 502 due to illumination of the specimen 502 by the subsystem and to generate output responsive to the detected light. For example, the optical based subsystem 501 shown in FIG. 5 includes two detection channels, one formed by collector 507, element 508, and detector 509 and another formed by collector 510, element 511, and detector 512. As shown in FIG. 5, the two detection channels are configured to collect and detect light at different angles of collection. In some instances, both detection channels are configured to detect scattered light, and the detection channels are configured to detect tight that is scattered at different angles from the specimen 502. However, one or more of the detection channels may be configured to detect another type of light from the specimen 502 (e.g., reflected light).

As further shown in FIG. 5, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 510, element 511, and detector 512 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 5 shows an embodiment of the optical based subsystem 501 that includes two detection channels, the optical based subsystem 501 may include a different number of detection channels (e.g., only one detection channel or two or more detection channels). In one such instance, the detection channel formed by collector 510, element 511, and detector 512 may form one side channel as described above, and the optical based subsystem 501 may include an additional detection channel (not shown) formed as another side channel that is positioned on the opposite side of the plane of incidence. Therefore, the optical based subsystem 501 may include the detection channel that includes collector 507, element 508, and detector 509 and that is centered in the plane of incidence and configured to collect and detect light at scattering angle(s) that are at or close to normal to the specimen 502 surface. This detection channel may therefore be commonly referred to as a "top" channel, and the optical based subsystem 501 may also include two or more side channels configured as described above. As such, the optical based subsystem 501 may include at least three channels (i.e., one top channel and two side channels), and each of the at least three channels has its own collector, each of which is configured to collect light at different scattering angles than each of the other collectors.

As described further above, each of the detection channels included in the optical based subsystem 501 may be configured to detect scattered light. Therefore, the optical based subsystem 501 shown in FIG. 5 may be configured for dark field (DF) output generation for specimens 502. However, the optical based subsystem 501 may also or alternatively include detection channel(s) that are configured for bright field (BF) output generation for specimens 502. In other words, the optical based subsystem 501 may include at least one detection channel that is configured to detect light specularly reflected from the specimen 502. Therefore, the optical based subsystems 501 described herein may be configured for only DF, only BF, or both DF and BF imaging. Although each of the collectors are shown in FIG. 5 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 514 may be configured to generate images of the specimen 502 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 5 is provided herein to generally illustrate a configuration of an optical based subsystem 501 that may be included in the system embodiments described herein or that may generate optical based output that is used by the system embodiments described herein. The optical based subsystem 501 configuration described herein may be altered to optimize the performance of the optical based subsystem 501 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 514 may be coupled to the components of the system 500 in any suitable manner (e.g., via one or more transmission media, which may include wired and/or wireless transmission media) such that the processor 514 can receive output. The processor 514 may be configured to perform a number of functions using the output. The system 500 can receive instructions or other information from the processor 514. The processor 514 and/or the electronic data storage unit 515 optionally may be in electronic communication with a wafer inspection tool, a wafer metrology tool, or a wafer review tool (not illustrated) to receive additional information or send instructions. For example, the processor 514 and/or the electronic data storage unit 515 can be in electronic communication with an SEM.

The processor 514, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 514 and electronic data storage unit 515 may be disposed in or otherwise part of the system 500 or another device. In an example, the processor 514 and electronic data storage unit 515 may be part of a standalone control unit or in a centralized quality control unit. Multiple processors 514 or electronic data storage units 515 may be used.

The processor 514 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 514 to implement various methods and functions may be stored in readable storage media, such as a memory in the electronic data storage unit 515 or other memory.

If the system 500 includes more than one processor 514, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 514 may be configured to perform a number of functions using the output of the system 500 or other output. For instance, the processor 514 may be configured to send the output to an electronic data storage unit 515 or another storage medium. The processor 514 may be further configured as described herein.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 514 may be configured according to any of the embodiments described herein. The processor 514 also may be configured to perform other functions or additional steps using the output of the system 500 or using images or data from other sources.

Various steps, functions, and/or operations of system 500 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 514 or, alternatively, multiple processors 514. Moreover, different subsystems of the system 500 may include one or more computing or logic systems. Therefore, the above description should not be interpreted as a limitation on the present disclosure but merely an illustration.

Various advantages are presented by embodiments of the present disclosure. Such embodiments include boron-based protective cap layers for EUV optics, namely: using a thick (between 5 and 30 nm) layer of boron to protect EUV optics; using a boron layer with thickness that is greater than or equal to 5 nm and optimized to be at the local reflectivity maximum of the multilayer mirror to protect EUV optics; using a thick (between approximately 2 and 25 nm) layer of boron carbide to protect EUV optics; using a thick (between approximately 2 to 10 nm) layer of boron nitride to protect EUV optics; using a stack of silicon/boron carbide/boron/boron nitride (from bottom to top) to protect EUV optics; and using born capping layers as a distributed spectral purity filter. Such embodiments can provide advantages including, inter alia, decreasing the cost and risk to design, manufacturing, and operation of EUV lithography equipment. Additionally, boron-based capping layers provide for easier cleaning with increased durability over multiple cycles. Such easier cleaning is enabled for embodiments of boron-based capping layers disclosed herein over ruthenium-based capping layers due to different crystal structure and dimension, as well as other chemical differences.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

We claim:

1. An optical element comprising:
   a first layer disposed on a substrate, wherein the first layer comprises silicon;
   a second layer disposed on the first layer, wherein the second layer comprises molybdenum, and wherein the molybdenum of the second layer is disposed directly on the silicon of the first layer;
   a terminal layer disposed on the second layer, wherein the terminal layer comprises silicon and wherein the silicon of the terminal layer is disposed directly on the molybdenum of the second layer; and
   a cap layer comprising boron, boron nitride, or boron carbide, wherein the cap layer is disposed on a side of the terminal layer opposite of the second layer, and wherein the boron, the boron nitride, or the boron carbide of the cap layer is disposed directly on the silicon of the terminal layer.

2. The optical element of claim 1, further comprising an extreme ultraviolet lithosystem including the optical element or an inspection system including the optical element.

3. The optical element of claim 1, wherein the cap layer comprises boron and has a thickness from 5 nm to 30 nm inclusive.

4. The optical element of claim 1, wherein the cap layer comprises boron nitride and has a thickness from 2 nm to 10 nm inclusive.

5. The optical element of claim 1, wherein the cap layer comprises boron carbide and has a thickness from 2 nm to 25 nm inclusive.

6. The optical element of claim 1, wherein the cap layer comprises a boron carbide cap layer, a boron cap layer, and a boron nitride cap layer.

7. The optical element of claim 1, further comprising a terminal cap layer disposed on the cap layer.

8. The optical element of claim 7, wherein the terminal cap layer comprises ruthenium, titanium dioxide, zirconium dioxide, or niobium oxide.

9. The optical element of claim 1, wherein an outer surface of the cap layer opposite the terminal layer is a farthest point of the optical element from the substrate.

* * * * *